(12) United States Patent
Takine et al.

(10) Patent No.: US 7,479,665 B2
(45) Date of Patent: Jan. 20, 2009

(54) SIDE-VIEW TYPE LIGHT EMITTING DEVICE

(75) Inventors: Kenji Takine, Anan (JP); Ryohei Yamashita, Anan (JP)

(73) Assignee: Nichia Corporation, Anan-Shi (JP)

( * ) Notice: Subject to any disclaimer, the term of this patent is extended or adjusted under 35 U.S.C. 154(b) by 213 days.

(21) Appl. No.: 11/356,039

(22) Filed: Feb. 17, 2006

(65) Prior Publication Data

US 2006/0186427 A1 Aug. 24, 2006

(30) Foreign Application Priority Data

Feb. 18, 2005 (JP) .............................. 2005-041636

(51) Int. Cl.
*H01L 33/00* (2006.01)
(52) U.S. Cl. ................. 257/99; 257/E51.018
(58) Field of Classification Search .................. 257/79, 257/98–100, 704, 710, E51.018–E51.022, 257/E33.001, E33.057, 774, 433, 435; 361/712, 361/717
See application file for complete search history.

(56) References Cited

U.S. PATENT DOCUMENTS 6,651,870 B2 * 11/2003 Teshima et al. ............. 228/246
6,834,977 B2 * 12/2004 Suehiro et al. ............. 362/187
2002/0175621 A1 11/2002 Song et al.
2004/0027067 A1 2/2004 Song et al.

FOREIGN PATENT DOCUMENTS

JP 2002-353515 A 12/2002
JP 2003-78176 A 3/2003

* cited by examiner

*Primary Examiner*—Davienne Monbleau
*Assistant Examiner*—Hoa B Trinh
(74) *Attorney, Agent, or Firm*—Birch, Stewart, Kolasch & Birch, LLP

(57) ABSTRACT

A side-view type light emitting device capable of effectively releasing heat generated on the surface of the substrate is provided. The side-view type light emitting device 1 comprising a substrate 1-1, a positive surface electrode 1-2, a negative surface electrode 1-3, a light emitting element 1-4, a sealing member 1-5 sealing the light emitting element 1-4, a positive rear surface electrode 1-6, a negative rear surface electrode 1-7, and a short-cut preventing member 1-8. The positive surface electrode 1-2 and the positive rear surface electrode 1-6 are electrically connected via a first through hole 1-9 and the negative surface electrode 1-3 and the negative rear surface electrode 1-7 are electrically connected via a second through hole 1-10.

12 Claims, 4 Drawing Sheets

(a)

(b)

(c)

SIDE-VIEW TYPE LIGHT EMITTING DEVICE

This application claims priority under 35 U.S.C. §119 of Japanese Patent Application No. 2005-41636 filed on Feb. 18, 2005, the contents of which are hereby incorporated by reference.

BACKGROUND OF THE INVENTION

1. Field of the Invention

The present invention relates to a side-view type light emitting device, in particular, to a side-view type light emitting device in which heat generated on the substrate surface is transmitted to a back side of the substrate via a through hole.

2. Description of the Related Art

A side-view type light emitting device in which heat generated on a substrate surface is transmitted to a back side of the substrate via a through-hole has been proposed in Japanese Laid-Open Patent Publication TOKUKAI No. 2003-78176. This related art type of LED is depicted in FIG. 4. That is, the side-view type light emitting device has a construction in which " . . . two or more LED elements (37,38,39) each having different emission color are mounted on the surface of the substrate (40), . . . each cathode of each LED element (37,38,39) is electrically connected with a common terminal electrode (41a, 41b) via one of two through holes provided in the substrate (40), . . . each anode of each LED element (37,38,39) is electrically connected respectively to a terminal electrode for anode (42,43,44) via an Au wire . . . ".

In this related art side-view type light emitting device, "the anode of the LED element (37) and the terminal electrode for anode (42) are electrically connected, and similarly, the anode of the LED element (38) and the terminal electrode for anode (43), and the anode of the LED element (39) and the terminal electrode for anode (44) are electrically connected respectively".

According to Japanese Laid-Open Patent Publication TOKUKAI No. 2003-78176, deterioration of the LED elements caused by heat can be reduced by using the above-described side-view type light emitting device.

However, in this related art side-view type light emitting device, both the common terminal electrodes (41a, 41b) and the terminal electrode for anode (43) are provided on the rear side of the substrate (40), so that the common terminal electrodes (41a,41b) and the terminal electrode for anode (43) may be accidentally connected through a connecting member such as a solder during the mounting process and short-circuiting occurs.

Therefore, in a related art side-view type light emitting device, it has been necessary to provide a certain margin between the common terminal electrodes (41a, 41b) and the electrode for anode (43). Consequently, there have been problems in a conventional side-view type light emitting device. Miniaturization of the device has been difficult to realize; and the area of the common terminal electrodes (41a,41b) each connected to the respective through hole can not be widened, so that heat generated on the surface of the substrate can not be transmitted to the back side of the substrate effectively in such a device.

SUMMARY OF THE INVENTION

Accordingly, an object of the present invention is to provide a side-view type light emitting device which is easily be downsized and capable of transmitting heat generated on the substrate surface to the back side of the substrate effectively.

According to the present invention, the problem described above can be solved by the method described below.

The present invention relates to a side-view type light emitting device comprising a substrate, a positive surface electrode disposed on the surface of the substrate, a negative surface electrode disposed on the surface of the substrate, a positive rear surface electrode disposed on the rear surface of the substrate, a negative rear surface electrode disposed on the rear surface of the substrate, a light emitting element mounted either on the positive surface electrode or on the negative surface electrode and electrically connected to corresponding positive surface electrode or negative surface electrode, a sealing member which seals the light emitting element, and at least one short-circuit preventing member disposed on the opposite side from the substrate of either or both of the positive rear surface electrode and the negative rear surface electrode.

DETAILED DESCRIPTION OF THE PREFERRED EMBODIMENTS

Figure 1:
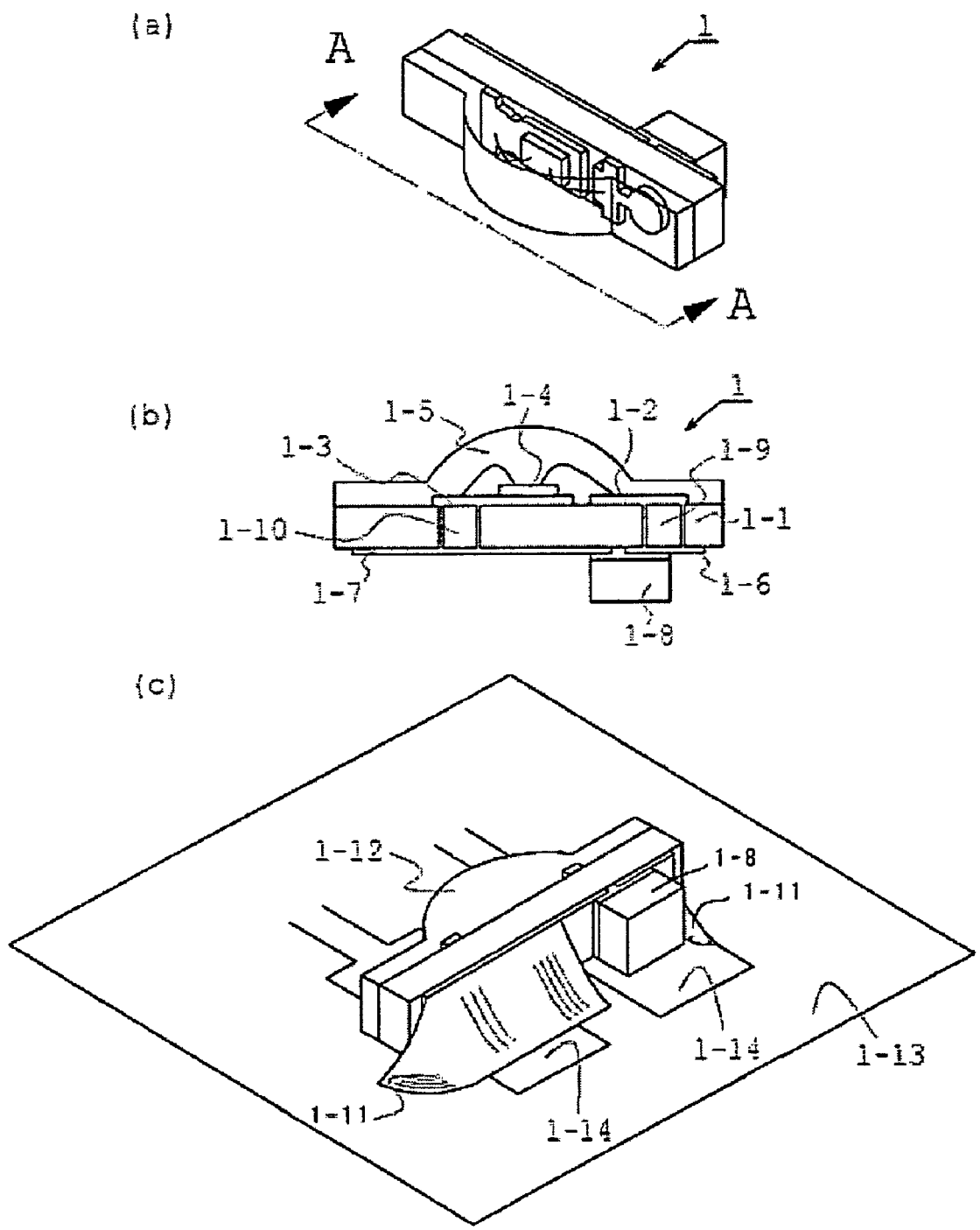
FIG. 1 shows a side-view type light emitting device 1 according to the first embodiment of the present invention.

Advantages of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

The present invention relates to a side-view type light emitting device that includes a substrate, a positive surface electrode disposed on the surface of the substrate, a negative surface electrode disposed on the surface of the substrate, a positive rear surface electrode disposed on the rear surface of the substrate, a negative rear surface electrode disposed on the rear surface of the substrate, a light emitting element mounted either on the positive surface electrode or on the negative surface electrode and electrically connected to corresponding positive surface electrode or negative surface electrode, a sealing member which seals the light emitting element, and at least one short-circuit preventing member disposed on the opposite side from the substrate of either or both of the positive rear surface electrode and the negative rear surface electrode.

According to the present invention, at least one short-circuit preventing member is disposed on the opposite side from the substrate of either or both of the positive rear surface electrode and the negative rear surface electrode. Accordingly, a barrier that is the short-circuit preventing member is provided between the connecting member disposed on the positive rear surface electrode and the connecting member disposed on the negative rear surface electrode. Therefore, the positive rear surface electrode and the negative rear surface electrode can be prevented from connecting to each other through the short-circuit preventing member during the mounting process. Thus, according to the present invention, a short-circuit between the positive rear surface electrode and the negative rear surface electrodes can be prevented effectively and the need for provision of a certain margin between them can be reduced. Accordingly, the side-view type light emitting device can be miniaturized, and by widening the area of the rear surface electrode, heat generated on the surface of the substrate can be transmitted effectively to the back side of the substrate.

Moreover, according to the present invention, the light emitting element is mounted on either the positive surface electrode or the negative surface electrode. Therefore, the light emitting element and the surface electrode directly contact each other and heat generated by the light emitting element can be transmitted to the back side of the substrate effectively via the through hole and the rear surface electrodes.

In order to prevent the connecting member from adhering to the sealing member, it is effective to dispose the electrodes, which are to be electrically connected with the mount substrate via the connecting member with a material such as solder, on the rear surface of the substrate. However, when the electrode is disposed on the rear surface of the substrate, there has been the above-described problem of short-circuiting. Thus, it has been difficult to obtain both prevention of the solder and the like from adhering to the sealing member and improvement in downsizing and heat dissipation in the side-view type light emitting device. In contrast, according to the present invention, a short-circuit preventing member effectively prevents short-circuiting of the electrode. Therefore, according to the present invention, while preventing adhesion of the connecting member such as a solder to the sealing member, downsizing and improvement in heat dissipation of the light emitting device can be achieved.

It is preferable that a rear surface electrode is also disposed on the side surface of the short-circuit preventing member which is provided to the side-view type light emitting device. With this construction, the area of the rear surface electrode can be further widened and heat generated on the surface of the substrate can be transmitted to the back side of the substrate more effectively.

Also, either or both of the first through hole or the second through hole are preferably provided in the vicinity under the light emitting element. By providing the light emitting element and the through hole in close proximity, heat generated by the light emitting element can be transmitted to the rear surface electrode in a shorter distance, and therefore heat dissipation can be improved. When the heat dissipation is improved, the operational stability of the side-view type light emitting device increases. Accordingly, in the side-view type light emitting device, both heat dissipation and stability can be improved.

Moreover, it is further preferable that either or both of the first through hole or the second through hole are provided under the light emitting element. With this construction, the distance between the light emitting element and a through hole can be further reduced, so that heat dissipation and the stability of the side-view type light emitting device can be further improved.

Now the present invention will be described more fully hereinafter by way of preferred embodiments with reference to the accompanying drawings.

FIG. 1 shows a side-view type light emitting device 1 according to the first embodiment of the present invention. FIG. 1(a) is a perspective view of the side-view type light emitting device 1. FIG. 1(b) is a cross-sectional view taken along line A-A in FIG. 1(a). FIG. 1(c) is a view showing the side-view type light emitting device 1 being mounted on amount substrate 1-13.

As shown in FIG. 1(c), the side-view type light emitting device 1 of the first embodiment is mounted on the mount substrate 1-13 with the side surface along the longitudinal direction as the mounting surface, and a positive rear surface electrode 1-6 and a negative rear surface electrode 1-7 are connected to respective electrodes for mounting 1-14 on the mount substrate 1-13 through a solder 1-11. The side-view type light emitting device 1 of the first embodiment emits light from a light emitting surface 1-12.

As shown in FIG. 1(b), the side-view type light emitting device 1 of first embodiment comprising a substrate 1-1, a positive surface electrode 1-2 disposed on the surface of substrate 1-1, a negative surface electrode 1-3 disposed on the surface of the substrate 1-1, a light emitting element 1-4 which is mounted on the negative surface electrode 1-3 and wire-bonded with the positive surface electrode 1-2 and the negative surface electrode 1-3, a sealing member 1-5 sealing the light emitting element 1-4, the positive rear surface electrode 1-7 disposed on the rear surface of the substrate 1-7, the negative rear surface electrode 1-7 disposed on the rear surface of the substrate 1-1, and a short-circuit preventing member 1-8 disposed on the respective sides opposite from the substrate of the positive rear surface electrode 1-6 and the negative rear surface electrode 1-7.

Here, the positive surface electrode 1-2 and the positive rear surface electrode 1-6 are electrically connected via a first through hole 1-9, and the negative surface electrode 1-3 and the negative rear surface electrode 1-7 are electrically connected via a second through hole 1-10.

In the side-view type light emitting device 1 of the first embodiment as described above, heat generated by the light emitting element 1-4 is transmitted to the positive surface electrode 1-2, the negative surface electrode 1-3, the through holes 1-9 and 1-10, the rear surface electrodes 1-6 and 1-7, and the solder 1-11. Thus, in side-view type light emitting device 1 of the first embodiment, heat generated on the surface of the substrate 1-1 can be transmitted to the back side of the substrate effectively.

Moreover, in the side-view type light emitting device 1 of the first embodiment, the short-circuit preventing member 1-8, which is a barrier, is provided between the solder 1-11 and the solder 1-11. Therefore, in the side-view type light emitting device 1 of the first embodiment, the distance between the positive rear surface electrode 1-6 and the negative rear surface electrode 1-7 can be reduced compared to a conventional side-view type light emitting device. Thus, according to side-view type light emitting device 1 of the first embodiment, downsizing of side-view type light emitting device 1 can be realized. Furthermore, in the side-view type light emitting device 1 of the first embodiment, a barrier which is the short-circuit preventing member 1-8 is provided between the solder 1-11 and the solder 1-11. Therefore, a larger amount of the solder 1-11 can be used for connecting the rear surface electrodes 1-6 and 1-7 and the electrode for mounting 1-14, compared to the conventional side-view type light emitting device. Therefore, heat dissipation in the side-view type light emitting device 1 of the first embodiment can be more effective than in the conventional side-view type light emitting device. The solder 1-11 is a conductive member, and in addition, with good thermal conductivity. Therefore, when a larger amount of the solder 1-11 is used, more heat can be transmitted from the surface of the substrate 1-1 to the back side of the substrate 1-1.

When the heat dissipation improves, stability in operation improves. Therefore, according to the first embodiment, operation stability in the side-view type light emitting device 1 can be improved.

In order to prevent the connecting member from adhering to the sealing member, it is effective to dispose the electrodes which are to be electrically connected with the mount substrate via the connecting member formed from a material such as a solder. However, when the electrode is disposed on the rear surface of the substrate, there has been the problem of short-circuiting as described above. Consequently, it has been difficult to prevent the solder and the like from adhering to the sealing member and to obtain downsizing of the device and improvement in heat dissipation in the conventional side-view type light emitting devices all together. On the contrary, according to the present invention, the short-circuit preventing member 1-8 is provided, so that short-circuit of the rear surface electrode 1-6 can be prevented efficiently. Therefore, according to the present invention, it becomes possible to effectively prevent the connecting member such as the solder 1-11 and the like from adhering to the sealing member 1-5 and to obtain downsizing and improvement in heat dissipation of the light emitting device 1.

Moreover, although not shown in the drawings, in a side-view type light emitting device in which the electrode is disposed on a side surface of the substrate, there has been a problem that the connecting member such as a solder extends along the side of the electrode and adheres to the sealing member. When the connecting member adheres to the sealing member, light from the light emitting element is blocked, and the optical output of the device is reduced. In the light emitting device according to the present invention, the electrode is not provided on the side surface of the substrate. Therefore, extension of the connecting member along the electrode nor eventual adhesion thereof to the sealing member does not occur, and consequently, the resulting reduction in the optical output does not occur.

Hereinafter, each component of the side-view type light emitting device 1 of the first embodiment will be described in more detail.

(Substrate 1-1)

A material which is easy to process and has durability can be used arbitrarily for the substrate 1-1. Various materials such as a glass epoxy resin, copper, aluminum, various alloys, and a ceramic can be used for the substrate 1-1. It is also possible to use other materials for the substrate 1-1. If a conductive material such as copper or aluminum is used, this material may be coated with a non-conductive material such as an oxide or a resin.

(Positive Surface Electrode 1-2, Negative Surface Electrode 1-3, Positive Rear Surface Electrode 1-6, and Negative Rear Surface Electrode 1-7)

In order to transmit heat from the light emitting element 1-4 to outside, a material with high thermal conductivity is suitable for the positive surface electrode 1-2, the negative surface electrode 1-3, the positive rear surface electrode 1-6, and the negative rear surface electrode 1-7, and Au, Cu, Al or an alloy thereof can be used suitably. Especially, copper and aluminum and the like are suitable in view of the processability. In addition, plating using a metal with high reflectivity or an alloy may also be applied. As such a metal, gold, silver, copper, nickel, and various alloys can be suitably employed. It is also possible to use other materials for the positive surface electrode 1-2, the negative surface electrode 1-3, the positive rear surface electrode 1-6, and the negative rear surface electrode 1-7.

(First through Hole 1-9, Second through Hole 1-10)

The first through hole 1-9 and the second through hole 1-10 are preferably made of a material having high heat conductivity in order to effectively transmit heat from the light emitting element 1-4 to outside. Each of the first and second through holes is formed by making a through hole in substrate 1-1, and applying a plating thereto using a metal or alloy having high reflectivity. As such a metal, gold, silver, copper, nickel, and various alloys can be employed suitably. It is also possible to use other materials for the first through hole 1-9 and the second through-hole 1-9.

For the sake of clarity, the numbers of the first through hole 1-9 and the second through hole 1-10 are described respectively as one in the first embodiment. However, in the present invention, the number of the first through hole 1-9 and the second through hole 1-10 are not limited as one.

The first through hole 1-9 and the second through hole 1-10 can be provided below or under the light emitting element 1-4. With this construction, heat dissipation of the side-view type light emitting device 1 can be improved and stability of operation can also be improved. The through holes 1-9 and 1-10 can be formed in other locations. However, when the through holes 1-9 and 1-10 are formed at the locations closer to the light emitting element 1-4, the heat dissipation can be further improved.

(Light Emitting Element 1-4)

Various semiconductor light emitting elements can be employed as the light emitting element 1-4. For example, a semiconductor light emitting element 1-4 fabricated by stacking an n-type nitride semiconductor and a p-type nitride semiconductor on a substrate such as sapphire, SiC, spinel, and GaN, by way of MOCVD method and the like, can be used suitably. The light emitting element 1-4 having a light emitting layer employing not only a nitride semiconductor such as GaN, GaAlN, InGaN, AlN, InN, InGaAlN, and GaInBN, but also various semiconductors such as InGaP, GaP, GaAs, GaAlAs, AlP, AlAs, ZnD, ZnSe, and SiC, can be used suitably.

In the present invention, the mounting location of the light emitting element 1-4 is not limited. However, as described in the first embodiment, heat generated by the light emitting element 1-4 can be transmitted to the back side of the substrate 1-1 effectively by mounting the light emitting element 1-4 on the negative surface electrode 1-3 or on the positive surface electrode 1-2.

(Sealing Member 1-5)

The sealing member 1-5 is only required to cover at least one portion of the light emitting element 1-4, and while protecting the light emitting element 1-4, the sealing member 1-5 firmly fixes the substrate 1-1 and the light emitting element 1-4. The light emitting element 1-4 and the substrate 1-1 can be bonded by using only a die-bonding agent. However, when stronger adhesion is required, adhesion can be improved by disposing the sealing member 1-5 so as to cover the light emitting element 1-4 and its adjacent portions.

A light-transmissive resin that transmits light having a desired wavelength is used for the sealing member 1-5. For example, an epoxy resin, a silicone resin, and an acrylic resin are suitable.

A light diffusion member capable of diffusing light may be mixed in the sealing member 1-5. Accordingly, diffusion of light can be improved and the side-view type light emitting device 1 with uniform emission can be obtained.

Moreover, in the sealing member 1-5, a fluorescent material which is excited by the light from the light emitting element 1-4 and emits light with a longer wavelength than that of the exciting light can be mixed therein. Accordingly, mixed light of light from the light emitting element and light from the fluorescent material can be emitted so that the side-view type light emitting device 1 capable of emitting light with various wavelengths can be obtained.

In the first embodiment, the shape of the sealing member 1-5 is illustrated as semi cylinder. In the present invention, it is also possible to employ other shapes arbitrarily for the sealing member 1-5. For example, a linear shape can be employed.

(Short-Circuit Preventing Member 1-8)

A material which is easy to process and has durability can be used arbitrarily for the short-circuit preventing member 1-8. Various materials such as a glass epoxy resin, copper, aluminum, various alloys, and ceramic can be used for the short-circuit preventing member 1-8. If a conductive material such as copper or aluminum is used, this material may be coated with a non-conductive material such as an oxide or a resin.

The above-described side-view type light emitting device 1 of the first embodiment can be manufactured by a method below. A method for manufacturing the side-view type light emitting device 1 includes a step of bonding the substrate 1-1 with the substrate 1-8. Each of the substrates 1-1 and 1-8 is provided with slots of different widths through the substrate, so as to sandwich the rear surface electrodes 1-6 and 1-7 such that the non-slotted portion of substrate 1-8 becomes the short circuit preventing member. The slots in substrate 1-1 have narrower width to define the light emitting device, and the slots in substrate 1-8 have wider width to define the short-circuit preventing member. The positive surface electrode 1-2 and the negative surface electrode 1-3 are disposed on the surface of the substrate 1-1. The process also includes bonding the light emitting element 1-4, and sealing the light emitting element 1-4 with the sealing member 1-5.

With this method, the substrate 1-1 having narrower slots with smaller width becomes "substrate 1-1" and the substrate 1-8 having slots with larger width forms the "short-circuit preventing member 1-8", in the above described first embodiment. That is, the slots with wider width in the substrate 1-8 define the short circuit preventing member when the construction is diced into individual light emitting devices.

Figure 2:
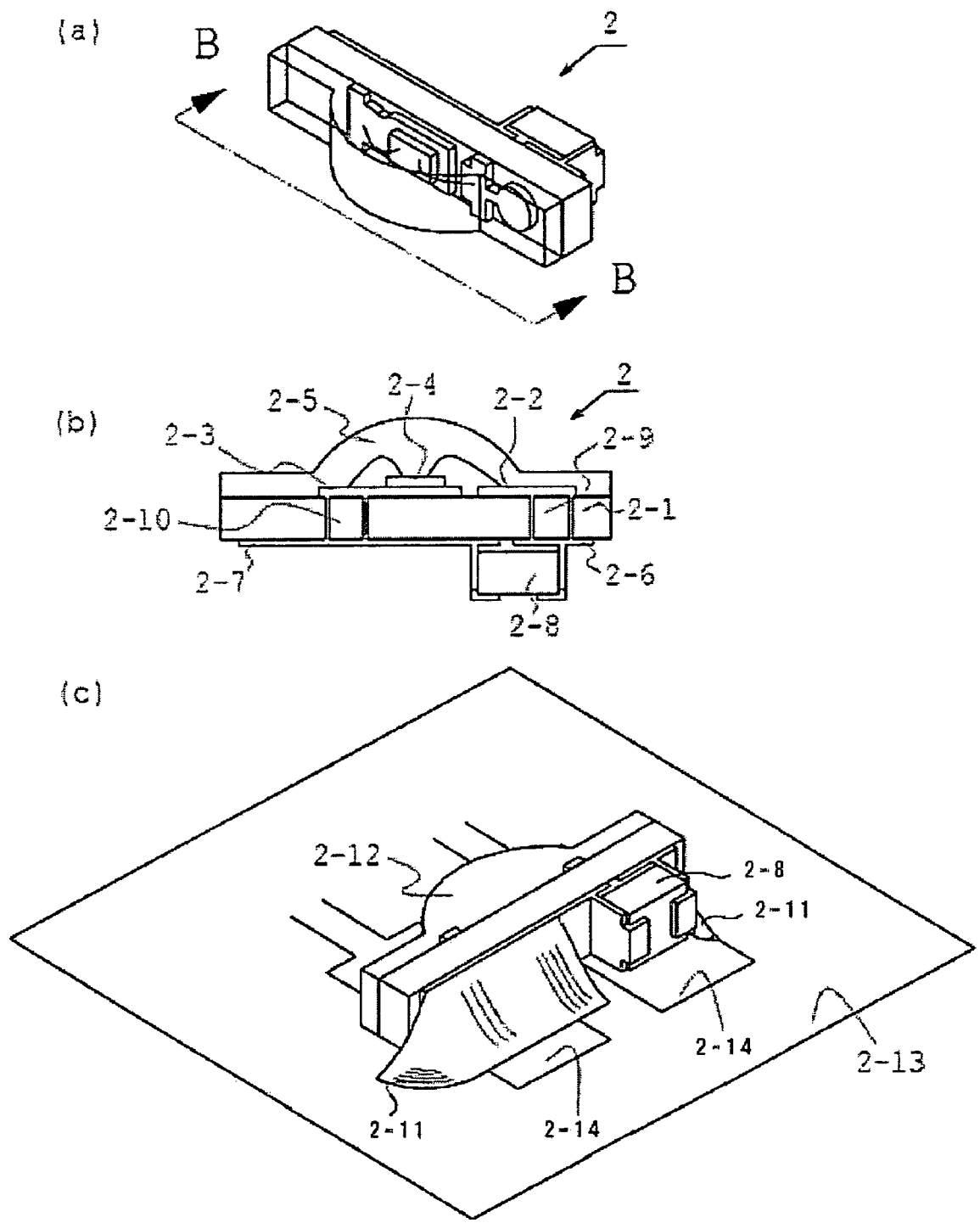
FIG. 2 shows a side-view type light emitting device 2 according to the second embodiment of the present invention.

FIG. 2 shows a side-view type light emitting device 2 according to the second embodiment of the present invention. FIG. 2(*a*) is a perspective view of side-view type light emitting device 2. FIG. 2(*b*) is a cross-sectional view taken along line B-B in FIG. 2(*a*). FIG. 2(*c*) is a view showing the side-view type light emitting device 2 being mounted on a mount substrate 2-13.

As shown in FIG. 2, in the second embodiment, a rear surface electrodes 2-6 and 2-7 are also disposed on the side surfaces of a short-circuit preventing member 2-8. Thus, according to the side-view type light emitting device 2 of the second embodiment, the areas of the rear surface electrodes 2-6 and 2-7 can be further increased so that heat generated on the surface of the substrate 2-1 can be transmitted to the back side of a substrate 2-1 much more effectively.

Figure 3:
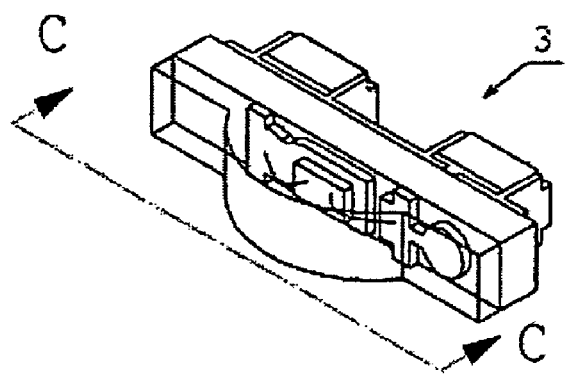
FIG. 3 shows a side-view type light emitting device 3 according to the third embodiment of the present invention.
Figure 3:
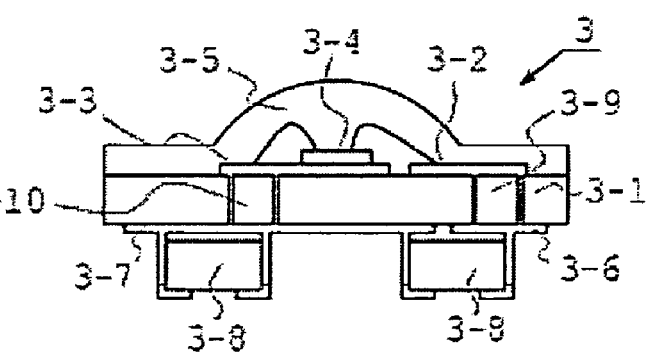
Figure 3:
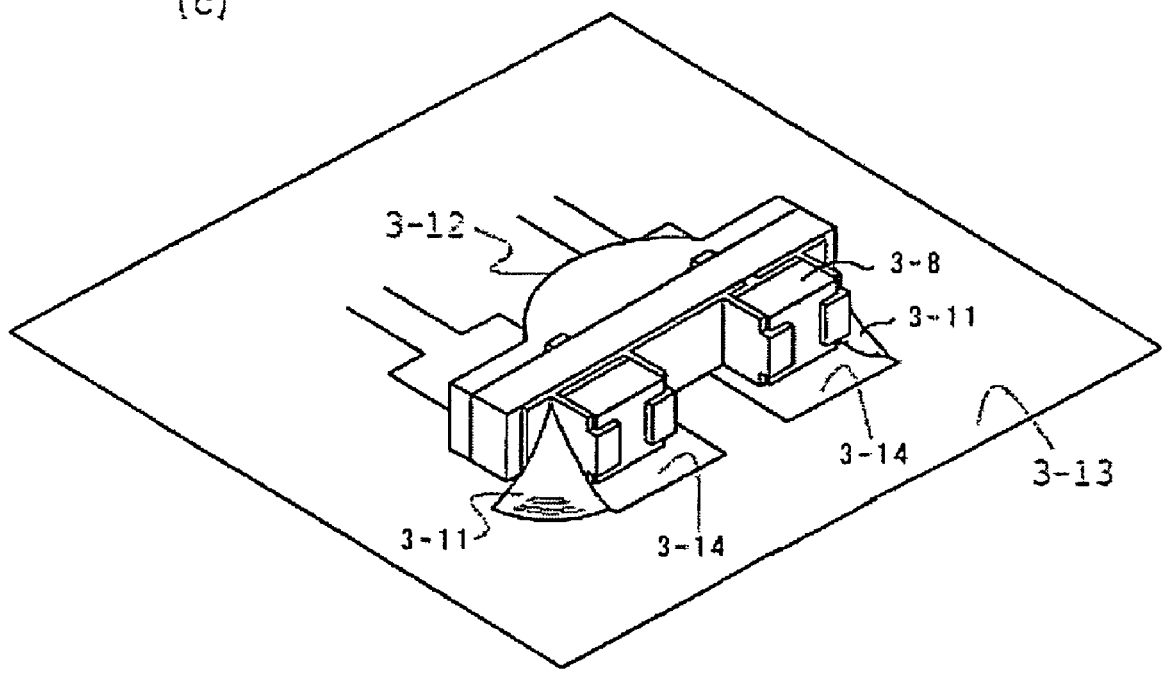
Figure 4:
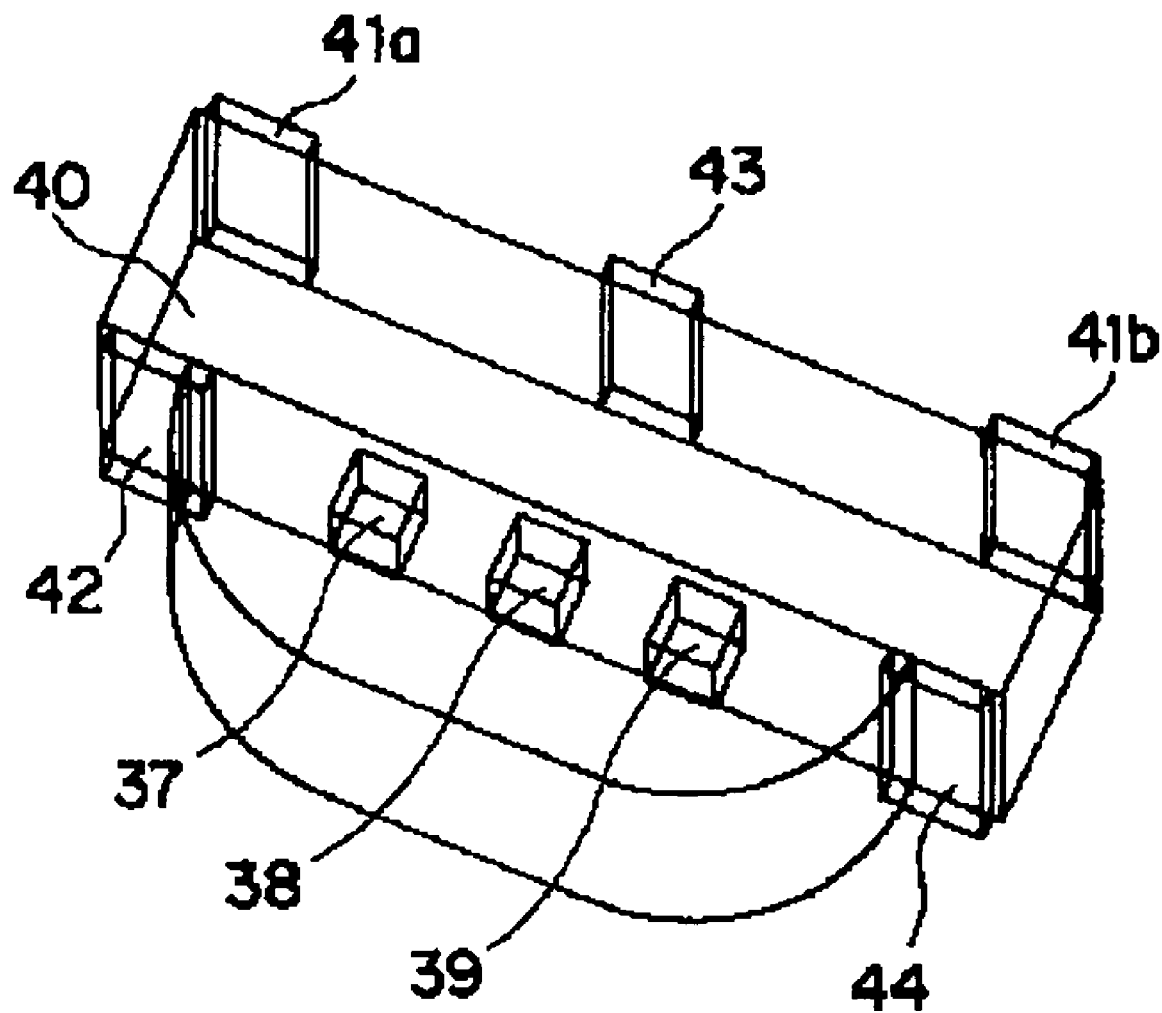
FIG. 4 shows a side-view type light emitting device of the related art.

FIG. 3 shows a side-view type light emitting device 3 according to the third embodiment of the present invention. FIG. 3(*a*) is a perspective view of the side-view type light emitting device 3. FIG. 3(*b*) is a cross-sectional view taken along line C-C in FIG. 3(*a*). FIG. 3(*c*) is a view showing the side-view type light emitting device 3 being mounted on a mount substrate 3-13.

As shown in FIG. 3, in the third embodiment, a short-circuit preventing member 3-8 is disposed on two places instead of one place as in the second embodiment, and the rear surface electrodes are also disposed on the side surfaces of each of the short-circuit preventing member 3-8. That is, a supplemental rear surface electrode may be disposed on a side surface of each of the short-circuit preventing member. Thus, according to side-view type light emitting device 3 of the third embodiment, the areas of the rear surface electrode can be further increased than that in the side-view type light emitting device 2 of the second embodiment, and at the same time, a greater amount of solder can be used than that in the second embodiment. Therefore, heat generated on the surface of the substrate 3-1 can be transmitted to the back side of the substrate 3-1 more effectively than in the side-view type light emitting device 2 of the second embodiment.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

It is to be understood that the foregoing descriptions and specific embodiments shown herein are merely illustrative of the best mode of the invention and the principles thereof, and that modifications and additions may be easily made by those skilled in the art without departing for the spirit and scope of the invention, which is therefore understood to be limited only by the scope of the appended claims.

What is claimed is:

1. A side-view type light emitting device, comprising:
    a substrate,
    a positive surface electrode disposed on a surface of said substrate,
    a negative surface electrode disposed on the surface of said substrate,
    a positive rear surface electrode disposed on a rear surface of said substrate,
    a negative rear surface electrode disposed on the rear surface of said substrate,
    at least one first through hole provided in said substrate to electrically connect said positive surface electrode and said positive rear surface electrode,
    at least one second through hole provided in said substrate to electrically connect said negative surface electrode and said negative rear surface electrode,
    a light emitting element mounted on either said positive surface electrode or said negative surface electrode and electrically connected to corresponding positive surface electrode and negative surface electrode,
    a sealing member sealing said light emitting element,
    at least one short-circuit preventing member disposed between said positive rear surface electrode and said negative rear surface electrode, and
    a first supplemental rear surface electrode disposed on a side surface of said short-circuit preventing member.

2. The side-view type light emitting device according to claim 1, further comprising a second supplemental rear surface electrode disposed on an opposite side surface of said short-circuit preventing member.

3. The side-view type light emitting device according to claim 1, wherein the short-circuit preventing member has a square or rectangular shape.

4. The side-view type light emitting device according to claim 1, wherein the short-circuit preventing member is formed from glass epoxy resin or ceramic.

5. The side-view type light emitting device according to claim 1, wherein at least one of said first through hole and second through hole is provided in a region under said light emitting element.

6. The side-view type light emitting device according to claim 1, wherein at least one of said first through hole and second through hole is provided under said light emitting element.

7. A side-view type light emitting device, comprising:
a substrate,
a positive surface electrode disposed on a surface of said substrate,
a negative surface electrode disposed on the surface of said substrate,
a positive rear surface electrode disposed on a rear surface of said substrate,
a negative rear surface electrode disposed on the rear surface of said substrate,
at least one first through hole provided in said substrate to electrically connect said positive surface electrode and said positive rear surface electrode,
at least one second through hole provided in said substrate to electrically connect said negative surface electrode and said negative rear surface electrode,
a light emitting element mounted on either said positive surface electrode or said negative surface electrode and electrically connected to corresponding positive surface electrode and negative surface electrode,
a sealing member sealing said light emitting element,
at least one short-circuit preventing member disposed between said positive rear surface electrode and said negative rear surface electrode, and
a second short-circuit preventing member disposed over the positive rear surface electrode or the negative rear surface electrode.

8. The side-view type light emitting device according to claim 7, wherein the second short-circuit preventing member is located over the negative rear surface electrode.

9. The side-view type light emitting device according to claim 7, further comprising a third supplemental rear surface electrode disposed on a side surface of said second short-circuit preventing member.

10. The side-view type light emitting device according to claim 7, further comprising a fourth supplemental rear surface electrode disposed on an opposite side surface of said second short-circuit preventing member.

11. The side-view type light emitting device according to claim 7, wherein the second short-circuit preventing member is formed from glass epoxy resin or ceramic.

12. The side-view type light emitting device according to claim 7, wherein the second short-circuit preventing member has a square or rectangular shape.

* * * * *